(12) United States Patent
Fukiage

(10) Patent No.: US 6,753,610 B1
(45) Date of Patent: Jun. 22, 2004

(54) SEMICONDUCTOR DEVICE HAVING MULTILAYER INTERCONNECTION STRUCTURE AND METHOD OF MAKING THE SAME

(75) Inventor: Noriaki Fukiage, Tama (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 09/657,055

(22) Filed: Sep. 7, 2000

Related U.S. Application Data

(63) Continuation of application No. PCT/JP00/01664, filed on Mar. 17, 2000.

(30) Foreign Application Priority Data

Mar. 19, 1999  (JP) ............................................. 11-076224

(51) Int. Cl.⁷ ........................... H01L 23/48; H01L 23/52
(52) U.S. Cl. ........................ 257/762; 257/751; 257/752; 257/758; 257/764
(58) Field of Search ................................ 257/751, 752, 257/753, 758, 762, 763, 764, 767, 769, 770; 438/622, 683, 685, 687

(56) References Cited

U.S. PATENT DOCUMENTS 5,858,873 A * 1/1999 Vitkavage et al. .......... 438/626
6,144,096 A * 11/2000 Lopatin ....................... 257/751

FOREIGN PATENT DOCUMENTS

| JP | 9-186102 | 7/1997 |
|----|----------|--------|
| JP | 9-260306 | 10/1997 |
| JP | 10-144627 | 5/1998 |
| JP | 10-209073 | 8/1998 |
| JP | 11-102877 | 4/1999 |

OTHER PUBLICATIONS

Gesheva et al., "Deposition of Characterization of CVD–Tungsten and Tungsten Carbonitrides on (100) Si", Ceramics International 22, 1996, pp. 87–89*

* cited by examiner

Primary Examiner—Hung Vu
(74) Attorney, Agent, or Firm—Finnegan, Henderson, Farabow, Garrett & Dunner, L.L.P.

(57) ABSTRACT

The object of the present invention is to provide a diffusion preventing film capable of inhibiting diffusion of Cu into an insulator film when Cu is used as a wiring material. This objective is attained by forming the diffusion preventing film from a crystalline WCN film. The WCN film, when subjected to X-ray diffraction, shows peaks at a first position between 36° to 38° and at a second position between 42° to 44°. The half-width of the peak at the first position is 3.2° or less, and the half-width of the peak at the second position is 2.6° or less. Since the WCN film has satisfactory coverage, it can form a thick barrier film in a concave with a high aspect ratio.

6 Claims, 15 Drawing Sheets

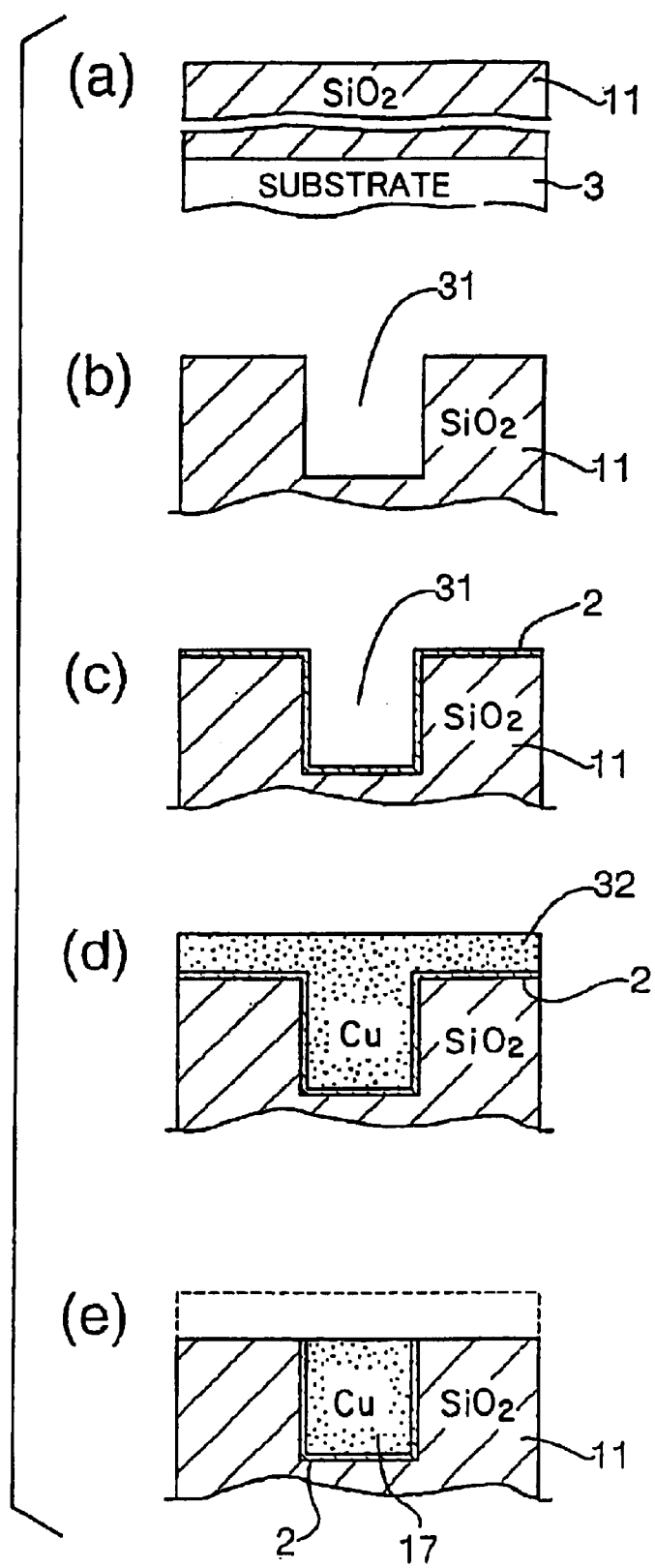
F I G. 2

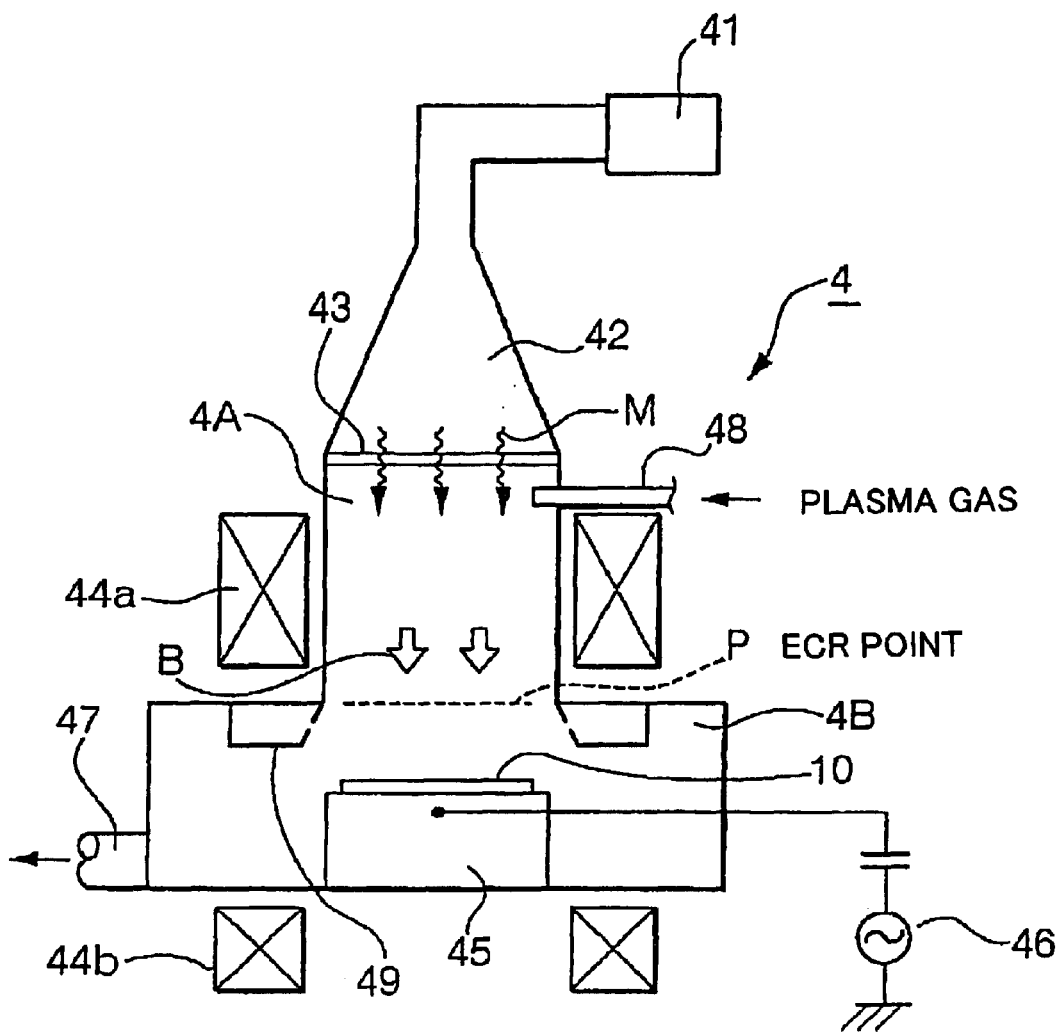
F I G. 5

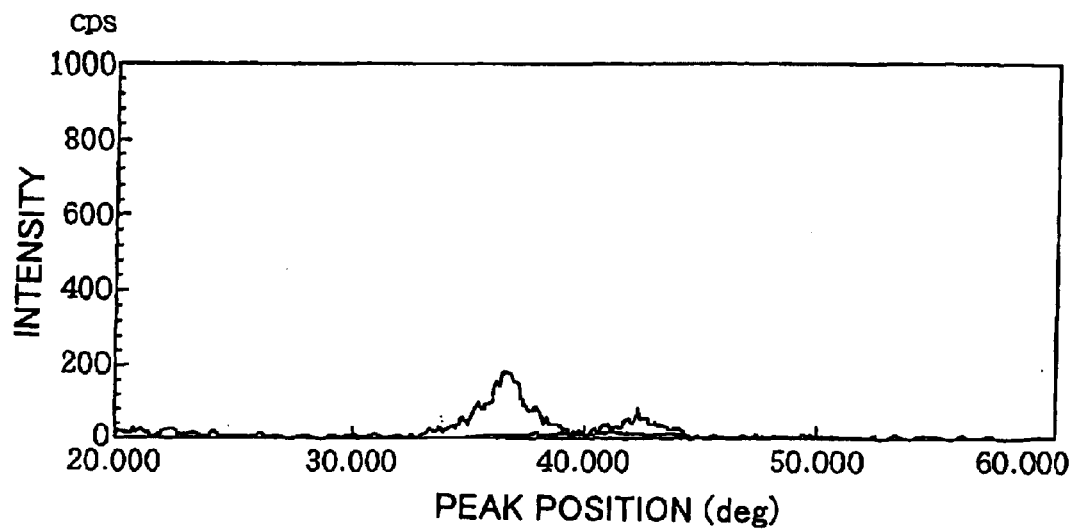
F I G. 6
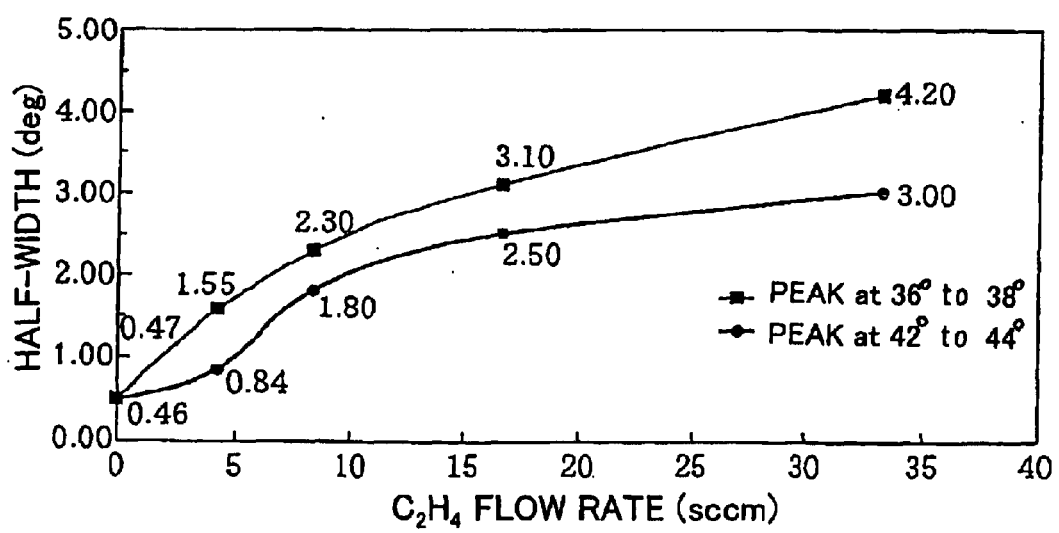
F I G. 7

| $C_2H_4$ FLOW RATE (SCCM) | HALF-WIDTH | | BARRIER PROPERTY AGAINST Cu |
|---|---|---|---|
| | FIRST PEAK | SECOND PEAK | |
| 0 | 0.46 | 0.47 | ○ |
| 4.2 | 1.55 | 0.84 | ○ |
| 8.3 | 2.30 | 1.80 | ○ |
| 16.7 | 3.10 | 2.50 | △ |
| 33.3 | 4.20 | 3.00 | × |

| GAS | HALF-WIDTH | | BARRIER PROPERTY AGAINST Cu |
|---|---|---|---|
| | FIRST PEAK | SECOND PEAK | |
| C₂H₄ | 2.3 | 1.8 | ○ |
| C₂H₆ | 3.2 | 2.6 | △ |
| C₂H₂ | 1.9 | 1.6 | ○ |

| | COVERAGE (%) | | |
|---|---|---|---|
| | B/A | C/A | D/A |
| WCN | 20 | 32 | 28 |
| WN | 16 | 24 | 20 |

FIG. 13

| | ADHESION STRENGH (psi) | |
|---|---|---|
| | $SiO_2$ | SiN |
| WCN | 4.5 | 4.2 |
| WN | 2.3 | 1.8 |

FIG. 14

| N/W RATIO | C/W RATIO | ADHESION STRENGH TO $SiO_2$/SiN (kpsi) |
|---|---|---|
| 0 | 0 | <1/<1 |
| 0 | 0.48 | 5.0/4.7 |
| 0 | 0.79 | 6.2/5.1 |
| 0 | 0.98 | 5.4/3.7 |
| 0 | 1.23 | 5.4/4.2 |
| 0.48 | 0 | 2.3/1.8 |
| 0.49 | 0.12 | 4.0/3.7 |
| 0.47 | 0.24 | 4.5/4.2 |
| 0.42 | 0.34 | 6.2/5.2 |
| 0.4 | 0.54 | 4.2/3.9 |
| 0.39 | 0.75 | 5.1/4.2 |
| 0.32 | 0.98 | 6.1/3.4 |
| 0.79 | 0 | 2.1/1.2 |
| 0.78 | 0.3 | 2.8/1.8 |
| 0.74 | 0.41 | 2.1/2.4 |
| 0.7 | 0.62 | 2.6/2.0 |

FIG. 15

| CF4 | A | B | C | D |
|---|---|---|---|---|
| 0sccm | 100% | 16% | 24% | 20% |
| 4.2sccm | 100% | 23% | 36% | 30% |
| 8.3sccm | 100% | 27% | 40% | 34% |
| 16.7sccm | 100% | 32% | 45% | 38% |
| C2H4 | | | | |
| 8.3sccm | 100% | 20% | 32% | 28% |

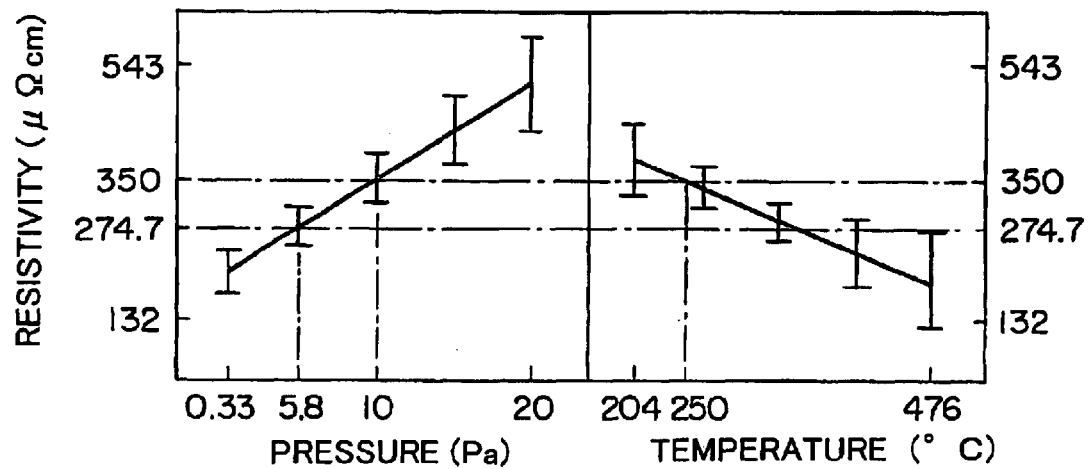
F I G. 20
| RESISTIVITY | HALF-WIDTH | |
|---|---|---|
| ($\mu \Omega$ cm) | FIRST PEAK | SECOND PEAK |
| 189 | 1.62 | 0.91 |
| 275 | 2.31 | 1.65 |
| 347 | 3.05 | 2.39 |
| 420 | 4.02 | 2.98 |
| 491 | 4.78 | 3.52 |
F I G. 21

SEMICONDUCTOR DEVICE HAVING MULTILAYER INTERCONNECTION STRUCTURE AND METHOD OF MAKING THE SAME

This is a continuation of PCT/JP00/01664, filed Mar. 17, 2000.

TECHNICAL FIELD OF THE INVENTION

This invention relates to a technique for preventing diffusion of copper from a wiring layer formed of the copper into an insulator film in a semiconductor device.

BACKGROUND OF THE INVENTION

To achieve high integration of semiconductor devices, contrivances, such as miniscule patterning and multilayering of circuits, are under way. Among them is a technique for forming a multiplayer interconnection. To impart a multi-player interconnection structure, an $n^{th}$ wiring layer and an $(n+1)^{th}$ wiring layer are connected together by a conductor layer, and a thin film, called an interlayer insulator film, is formed in a region other than the conductor layer.

An aluminum (Al) layer has been used as a wiring layer. In recent years, it has been studied to use copper (Cu), which is lower in resistance than Al and withstands electromigration, as a wiring material. The Cu has a much greater diffusion coefficient than that of Al, and tends to diffuse into silicon and an oxide film.

In using Cu for wiring, therefore, a barrier film about 200 angstroms thick, for example, needs to be formed between the insulator film and the Cu wiring layer in order to prevent Cu diffusion into the device. As a material for the barrier film, the use of TiN, TaN or WN has been considered. With the recent increase in the integration of semiconductor devices, the aspect ratio of a via hole or the like has become greater. Thus, the use of $WC_xN_y$ with better coverage has been proposed (e.g., see Japanese Unexamined Patent Publication No. Hei 10-209073).

This publication discloses a technology for depositing a thin film of $WC_xN_y$ having an amorphous structure, by reacting a starting material gas containing W, such as $WF_6$, $W(N(CH_3)_2)_6$, or $W(N(C_2H_5)_2)_6$, a hydrocarbon gas, such as $CH_4$, and a nitrogen supply source, such as a nitrogen plasma.

However, since the $WC_xN_y$ film obtained by the above method has an amorphous structure, it crystallizes from the amorphous structure in response to temperature, and this structural change of the film poses the problem of deteriorating the barrier properties.

SUMMARY OF THE INVENTION

The object of the present invention is to provide a semiconductor device with a copper diffusion preventing film having high barrier properties, and a method of making the semiconductor device.

To attain this objective, the present invention provides a semiconductor device, which includes: an insulator film formed on a substrate; a wiring layer of copper formed on the insulator film; and a copper diffusion preventing film, formed between the insulator film and the wiring film, that prevents copper diffusion from the wiring layer to the insulator film.

The copper diffusion preventing film is preferably a crystalline film, that, when subjected to X-ray diffraction, shows peaks at a first position at 36 degrees or more, but 38 degrees or less, and at a second position at 42 degrees or more, but 44 degrees or less. The higher the crystallinity of the copper diffusion preventing film, the higher the barrier properties. The crystallinity can be expressed as the half-width of the peak. The copper diffusion preventing film preferably has a half-width of 3.2 degrees or less for the peak at the first position at 36° to 38°, and preferably has a half-width of 2.6 degrees or less for the peak at the second position at 42° to 44°.

The copper diffusion preventing film may be formed from a film containing tungsten and carbon.

The present invention also provides a method of making a semiconductor device, which includes the steps of converting a gas containing tungsten, carbon, nitrogen and hydrogen into a plasma, and forming a crystalline copper diffusion preventing film by means of the plasma, the copper diffusion preventing film containing tungsten, carbon and nitrogen, and, when subjected to X-ray diffraction, showing peaks at a first position at 36 degrees or more, but 38 degrees or less, and at a second position at 42 degrees or more, but 44 degrees or less in X-ray diffraction, wherein a process temperature during formation of the copper diffusion preventing film is 250° C. or higher, preferably 250° C. to 500° C.

Furthermore, the present invention provides a method for producing a semiconductor device, which includes the steps of converting a gas containing tungsten, carbon, nitrogen and hydrogen into a plasma, and forming a crystalline copper diffusion preventing film by means of the plasma, the copper diffusion preventing film containing tungsten, carbon and nitrogen, and, when subjected to X-ray diffraction, showing peaks at a first position at 36 degrees or more, but 38 degrees or less, and at a second position at 42 degrees or more, but 44 degrees or less in X-ray diffraction, wherein a process pressure during formation of the copper diffusion preventing film is 10 pa or less, preferably 5 pa or less.

The gas containing tungsten, carbon, nitrogen and hydrogen preferably includes a hydrocarbon gas. In this case, the hydrocarbon gas preferably has a multiple bond. Also preferably, the gas containing tungsten, carbon, nitrogen and hydrogen includes a carbon-fluorine compound gas.

In performing the method of the present invention, it is preferred to generate a plasma by an interaction between a high frequency wave and a magnetic field, and to convert the gas into a plasma with the use of the plasma.

BRIEF DESCRIPTION OF THE DRAWINGS

FIGS. 2(a) to 2(e) are a process chart showing an example of a method for producing the semiconductor device according to the present invention;

FIG. 5 is a sectional view showing an ECR plasma processing apparatus for performing a WCN film-forming process;

FIG. 6 is a graph showing the results of X-ray diffraction of the WCN film;

FIG. 7 is a graph showing the relationship between the flow rate of $C_2H_4$ and the half-width;

FIG. 13 is a table for comparing coverage by a WCN film and coverage by a WN film;

FIG. 14 is a table for comparing adhesion of a WCN film and adhesion of a WN film;

FIG. 15 is a table for showing the relationship between the proportions of C and N in a WCN film and the adhesion of the WCN film;

FIG. 20 is a graph explaining the relationship between the process temperature/the process pressure and the resistivity of the resulting WCN film.

FIG. 21 is a table showing the relationship between the crystallinity and the resistivity.

DESCRIPTION OF THE PREFERRED EMBODIMENTS

Figure 1:
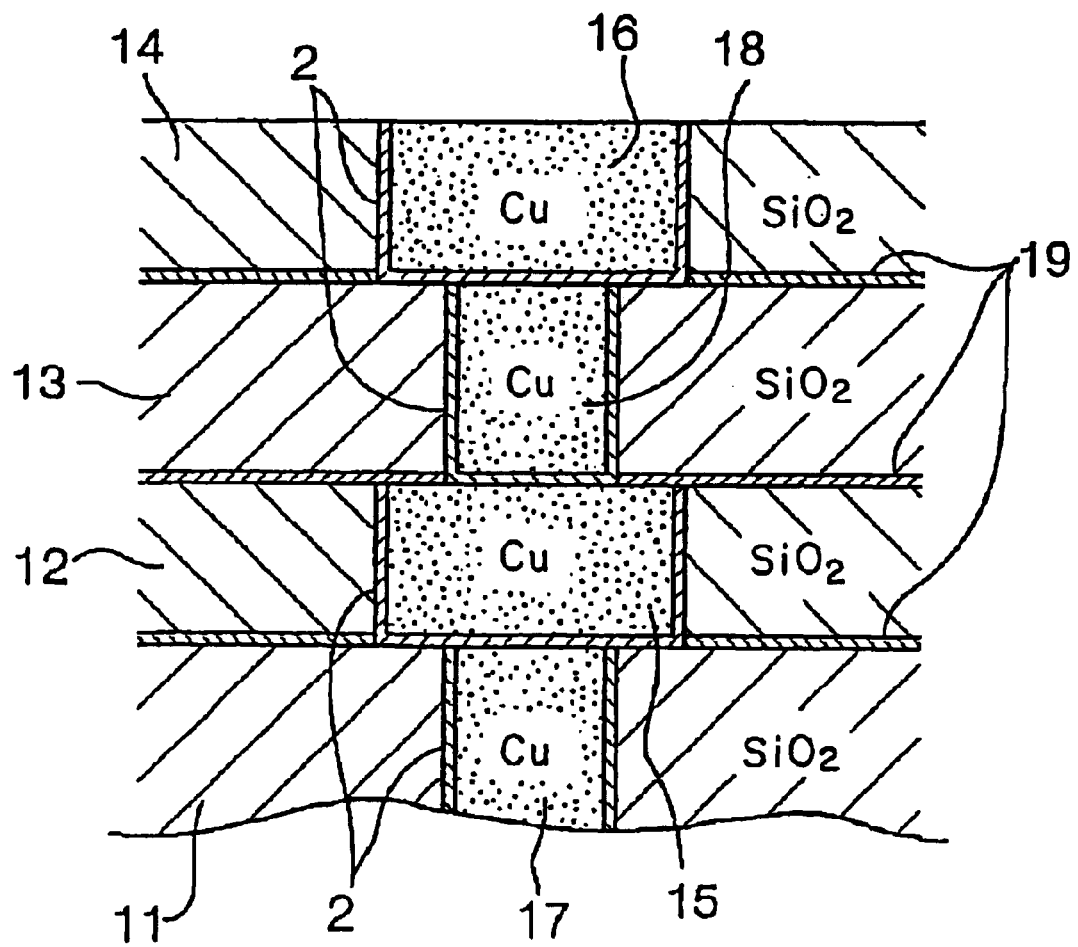
FIG. 1 is a sectional view showing a part of a structure of an example of a semiconductor device according to the present invention.

The concrete structure of a semiconductor device according to the present invention will now be described with reference to FIG. 1. This drawing shows a part of the semiconductor device. The reference numerals 11 to 14 in the drawing are each an interlayer insulator film comprising a $SiO_2$ film and having a thickness of, for example, about 5,000 angstroms. The reference numerals 15 and 16 are each a wiring layer comprising a Cu layer, for example, about 5,000 angstroms thick. The reference numerals 17 and 18 are each a connecting layer comprising a Cu layer and connecting the Cu wiring layers 15 and 16 together.

A barrier film 2 is formed between the Cu wiring layers 15, 16, the Cu connecting layers 17, 18 and the $SiO_2$ films 11 to 14, i.e., on the side walls and bottom walls of the Cu wiring layers 15, 16 and the Cu connecting layers 17, 18. The barrier film 2 is a copper diffusion preventing film comprising a WCN film as a crystalline film containing W, C and N and having a thickness of, for example, 200 angstroms. In the present embodiment, moreover, an SiN film 19, for example, about 200 angstroms thick is formed between the $SiO_2$ films adjacent vertically.

An example of a method for producing such a semiconductor device will be described with reference to FIGS. 2(a) to 2(e) to 4(a) to 4(c). As shown in FIG. 2(a), an $SiO_2$ film 11 is formed on the surface of a substrate 3. The $SiO_2$ film 11 is formed by converting film forming gases into a plasma, for example, with the use of an Ar gas as a plasma gas, and an $SiH_4$ gas and an $O_2$ gas as the film forming gases, for example, in an ECR plasma processing apparatus (see FIG. 5) utilizing ECR (electron cyclotron resonance) to be described later on.

The ECR plasma processing apparatus for performing ECR plasma treatment will now be described briefly, referring to FIG. 5. The interior of a vacuum vessel 4 comprising a plasma chamber 4A and a film forming chamber 4B is supplied with a high frequency wave (microwave) M of, for example, 2.45 GHz from a high frequency power source unit 41 via a wave guide 42 and a transmissive window 43. A magnetic field B, directed from the plasma chamber 4A toward the film forming chamber 4B and having a magnetic intensity of 875 gausses near an ECR point P, is formed by a main electromagnetic coil 44a and an auxiliary electromagnetic coil 44b provided around the plasma chamber 4A and below the film forming chamber 4B, respectively. By the interaction between the magnetic field B and the microwave M, electron cyclotron resonance is generated at the ECR point P.

To form the $SiO_2$ film 11 by this device, a substrate, e.g., a semiconductor wafer (hereinafter referred to as "wafer"), 10 is placed on a table 45 provided in the film forming chamber 4B in the vacuum vessel 4 which is maintained beforehand in a predetermined vacuum atmosphere. A plasma gas, e.g. an Ar gas, is introduced into the plasma chamber 4A via a plasma gas supply pipe 48. The microwave M of, for example, 2.45 GHz is supplied from the high frequency power source unit 41 into the vacuum vessel 4. Also, the magnetic field B is formed by the main electromagnetic coil 44a and the auxiliary electromagnetic coil 44b. Then, film forming gases are introduced into the film forming chamber 4B via a film forming gas supply section 49. Then, a bias voltage is applied to the bearing stand 45 by a high frequency power source unit 46. In this manner, the film forming gases are converted into a plasma by electron cyclotron resonance to perform film forming treatment.

Then, treatment for forming a Cu connecting layer 17 in the $SiO_2$ film 11 is carried out. According to this treatment, as shown in FIG. 2(b), a via hole 31 is formed for burying Cu in that portion in the surface of the $SiO_2$ film 11 where a connecting line of Cu is to be formed. The via hole 31 is formed by forming a predetermined pattern in the surface of the $SiO_2$ film 11, and etching the pattern by an etching device (not shown).

Then, as shown in FIG. 2(c), a WCN film 2 is formed on the entire surface of the $SiO_2$ film 11 where the via hole 31 has been formed. At this time, an Ar (argon) gas, for example, is used as a plasma gas, and gases containing tungsten (W), nitrogen (N), hydrogen (H), and carbon (C), such as $WF_6$ gas, $N_2$ gas, $C_2H_4$ gas and $H_2$ gas, are used as film forming gases. An example of the concrete process conditions is microwave power 2.7 kw, main electromagnetic coil current 83A, auxiliary electromagnetic coil current 0A, introduced gas flow rates $WF_6/N_2/C_2H_4/H_2/Ar$=8.3/8.3/8.3/83.3/100 (unit: sccm), wafer temperature 330° C., and process pressure 0.27 Pa. Under these process conditions, the film forming gases are converted into a plasma. Using this plasma, the WCN film 2 is formed on the entire surface of the $SiO_2$ film 11, including the inner wall surface of the via hole 31.

The present invention is characterized by using a WCN film, especially a crystalline WCN film, as the barrier film. Although the composition of the WCN film is expressed as $WC_xN_y$, the WCN film is described herein as a "WCN" film for simplicity. The composition of the WCN film can be set in a predetermined range by varying the flow rate ratio of the respective film forming gases.

Then, as shown in FIG. 2(d), a Cu layer 32 is formed on the surface of the WCN film 2, etc. to bury Cu in the via hole 31. Then, as shown in FIG. 2(e), a CMP treatment (polishing treatment) is performed by a CMP device (not shown) to remove the unnecessary Cu layer 32 and WCN film 2 on the surface of the $SiO_2$, film 11, i.e., the Cu layer 32 and the WCN film 2 other than that on the inner wall surface of the via hole 31, by polishing. In this manner, Cu is buried in the via hole 31, formed in the $SiO_2$ film 11, via the WCN film 2 to form a Cu connecting layer 17.

Figure 3:
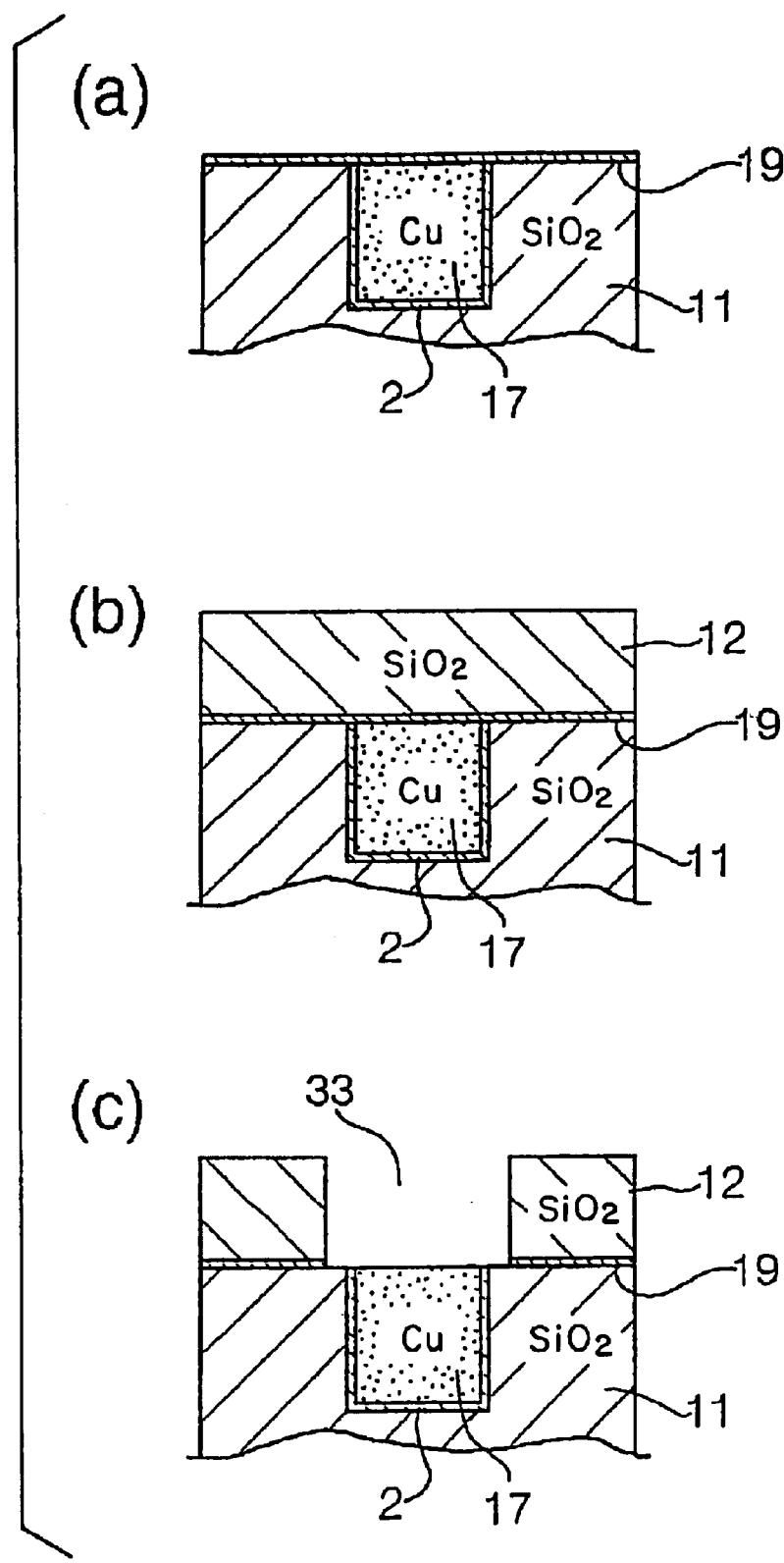
FIGS. 3(a) to 3(c) are a process chart showing an example of a method for producing the semiconductor device according to the present invention.

Then, a treatment is performed for forming a Cu wiring layer 15 on the surface of the $SiO_2$ film 11 in which the Cu connecting layer 17 has thus been formed. According to this treatment, as shown in FIG. 3(a), an SiN film 19 is formed on the surface of the $SiO_2$ film 11. This treatment is performed by converting film forming gases into a plasma with the use of an Ar gas as a plasma gas, and an $SiH_4$ gas and an $N_2$ gas as the film forming gases, in the aforementioned ECR plasma processing apparatus.

Then, as shown in FIG. 3(b), an $SiO_2$ film 12 is formed on the surface of the SiN film 19, for example, by the same method as in the step shown in FIG. 2(a). At this time, diffusion of Cu from the Cu connecting layer 17 to the $SiO_2$ film 12 is prevented, because the SiN film 19 is interposed between the $SiO_2$ film 11 and the $SiO_2$ film 12.

Then, as shown in FIG. 3(c), a trench 33, intended to bury Cu in the portion of the surface of the $SiO_2$ film 12 where wiring of Cu is to be formed, is formed by the same method as in the step shown in FIG. 2(b). Then, as shown in FIG. 4(a), a WCN layer 2 is formed on the entire surface of the $SiO_2$ film 12, in which the trench 33 has been formed, for example, by the same method as in the step shown in FIG. 2(c).

Figure 4:
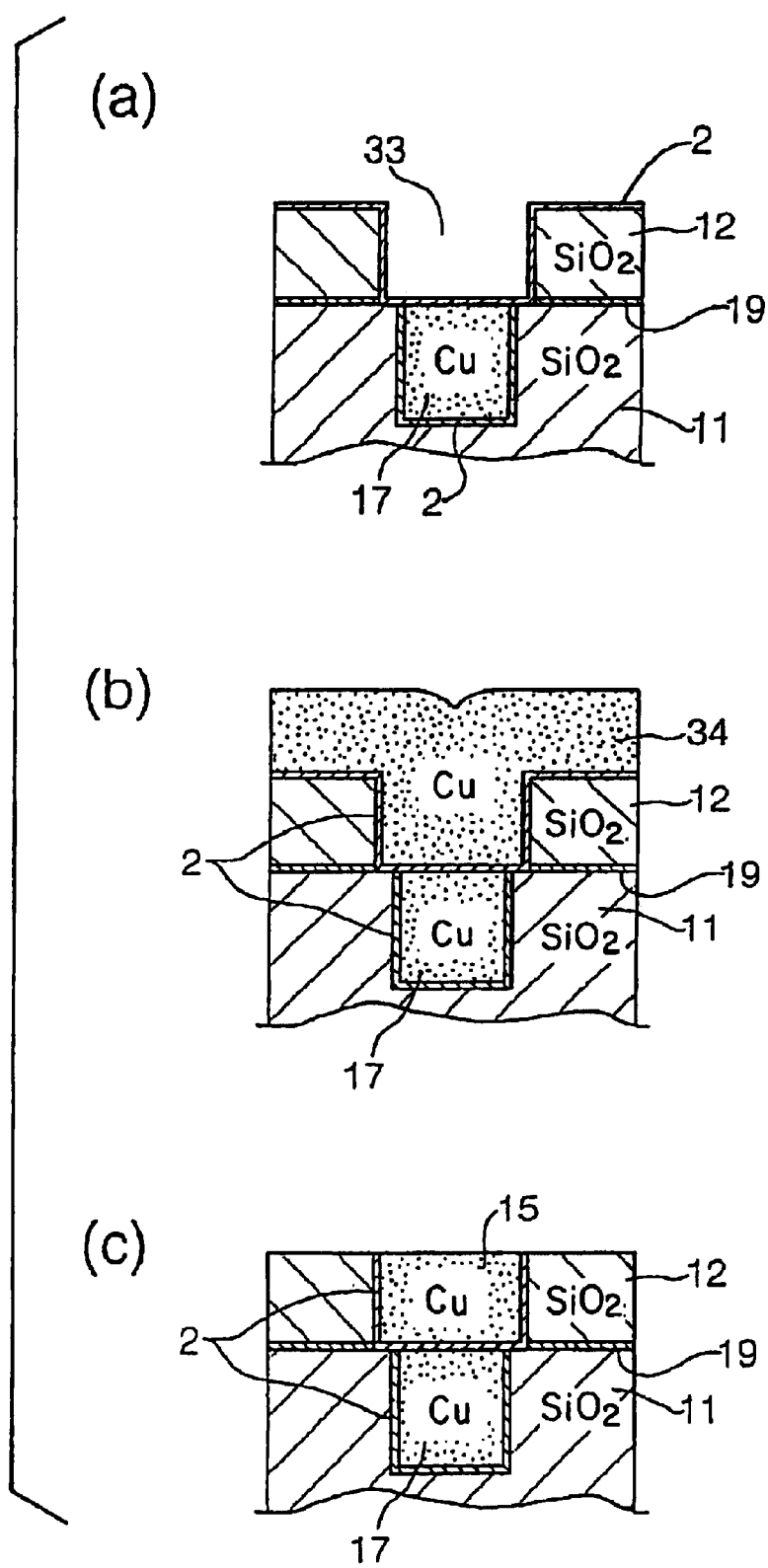
FIGS. 4(a) to 4(c) are a process chart showing an example of a method for producing the semiconductor device according to the present invention.

Then, as shown in FIG. 4(b), a Cu layer 34 is formed on the surface of the WCN film 2 to bury Cu in the trench 33. Then, as shown in FIG. 4(c), a CMP treatment is performed to form a Cu wiring layer 15.

The so produced semiconductor device has a barrier film comprising the WCN film 2. Thus, as demonstrated by the results of experiments to be described later on, diffusion of Cu from the Cu wiring layer 15 or the Cu connecting layer 17 into the $SiO_2$ film 11, etc., as interlayer insulator films, is prevented. Thus, damage to the device due to diffusion of Cu into the insulator film is inhibited, the reliability of the semiconductor device is enhanced, and the quality of the semiconductor device is improved.

A WCN film was actually formed, and its characteristics were measured by the X-ray diffraction method. The WCN film was formed Ad under the following process conditions by means of the ECR plasma processing apparatus shown in FIG. 5: Microwave power 2.7 kw, main electromagnetic coil current 83A, auxiliary electromagnetic coil current 0A, introduced gas flow rates $WF_6/N_2/C_2H_4/H_2/Ar=8.3/8.3/4.2/83.3/100$ (unit: sccm), wafer temperature 330° C., and process pressure 0.26 Pa. As a result, the WCN film was confirmed to be crystalline. That is, when the WCN film was subjected to the X-ray diffraction using an X-ray tube of Cu, a spectrum having peaks at 36.577 degrees and 42.363 degrees was appeared, as shown in FIG. 6.

The detailed structure of the WCN film is unknown, but according to the ASTM data, peaks of $W_2N$ are known to appear at 37.77 degrees and 43.89 degrees. When C is incorporated into the $W_2N$ structure, the structure may change, and the peak positions may shift, causing the peaks to appear at positions displaced by several degrees. Hence, these two peaks are presumed to result from WCN. Thus, the WCN film is understood to have a crystal structure. When the height of the peak was designated as h, the half-width that means the width at a half of the height (i.e. h/2), was 1.554 degrees for the peak at 36.577 degrees, and 0.841 degree for the peak at 42.363 degrees.

Next, an explanation will be offered for an example of experiments conducted to ascertain the relationship between the crystallinity of the WCN film and its copper diffusion preventing properties (barrier properties). A WCN film was formed under the following process conditions by means of the ECR plasma processing apparatus shown in FIG. 5: Microwave power 2.7 kw, main electromagnetic coil current 83A, auxiliary electromagnetic coil current 0A, introduced gas flow rates $WF_6/N_2/C_2H_4/H_2/Ar=8.3/8.3/0-33.3/83.3/100$ (unit: sccm), wafer temperature 330° C., and process pressure 2.5–2.8 Pa. On this occasion, X-ray diffraction was performed of the WCN films formed under the respective conditions, with the flow rate of $C_2H_4$ being varied in the range of 0 to 33.3 sccm, and the barrier properties of the WCN films against Cu were measured.

The barrier properties were evaluated by the following method: A WCN film 500 Angstroms thick was formed on a silicon substrate under the above-described process conditions. A film of Cu 5,000 Angstroms thick was formed on the WCN film by sputtering to prepare a sample. This sample was annealed in an $N_2$ atmosphere for 30 minutes at a temperature of 600° C., and then subjected to SIMS (secondary ion mass spectroscopy) to analyze the amounts of Cu, WCN and Si. The sample was also observed microscopically for the surface of Cu after annealing.

Figures 8, 9:
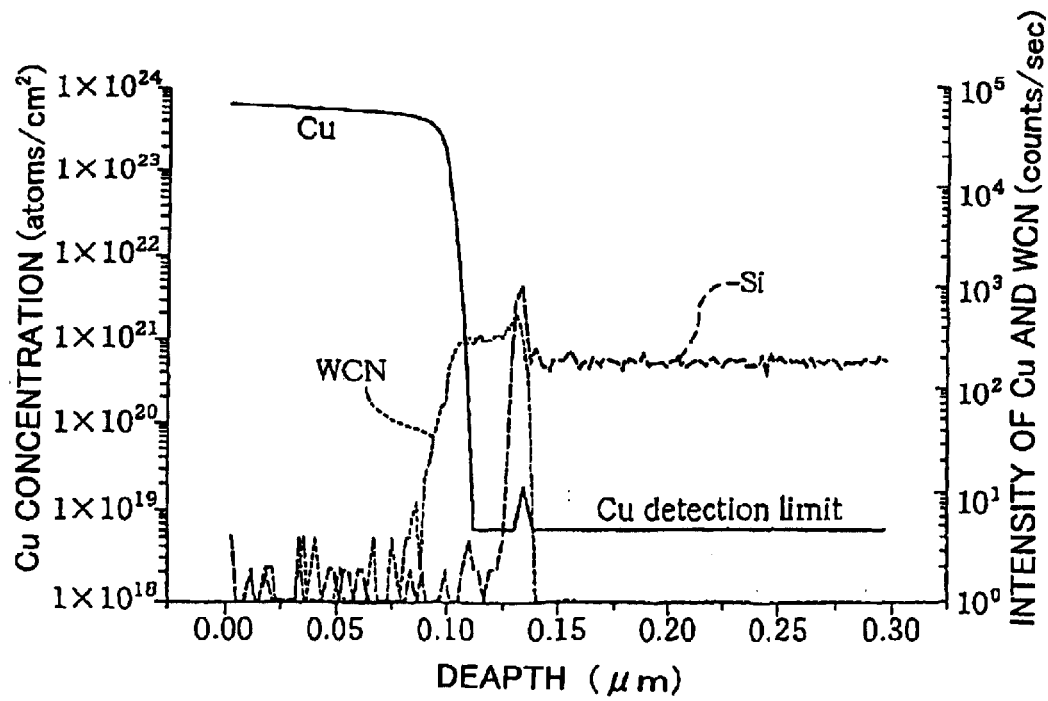
FIG. 8 is a table showing the relationship among the flow rate of $C_2H_4$, the half-width, and the barrier properties against Cu.
FIG. 9 is a graph showing the results of SIMS analysis of the semiconductor device.

The results are shown in FIGS. 7, 8 and 9. FIG. 7 shows the relationship between the flow rate of $C_2H_4$ and the half-width for each of the peak at 36° to 38°, i.e., "the first peak", and the peak at 42° to 44°, i.e., "the second peak", the peaks ascribed to the WCN film. FIG. 8 shows the relationship among the flow rate of $C_2H_4$, the crystallinity of the WCN film, and its barrier properties. FIG. 9 shows the results of analysis by SIMS.

Figure 10:
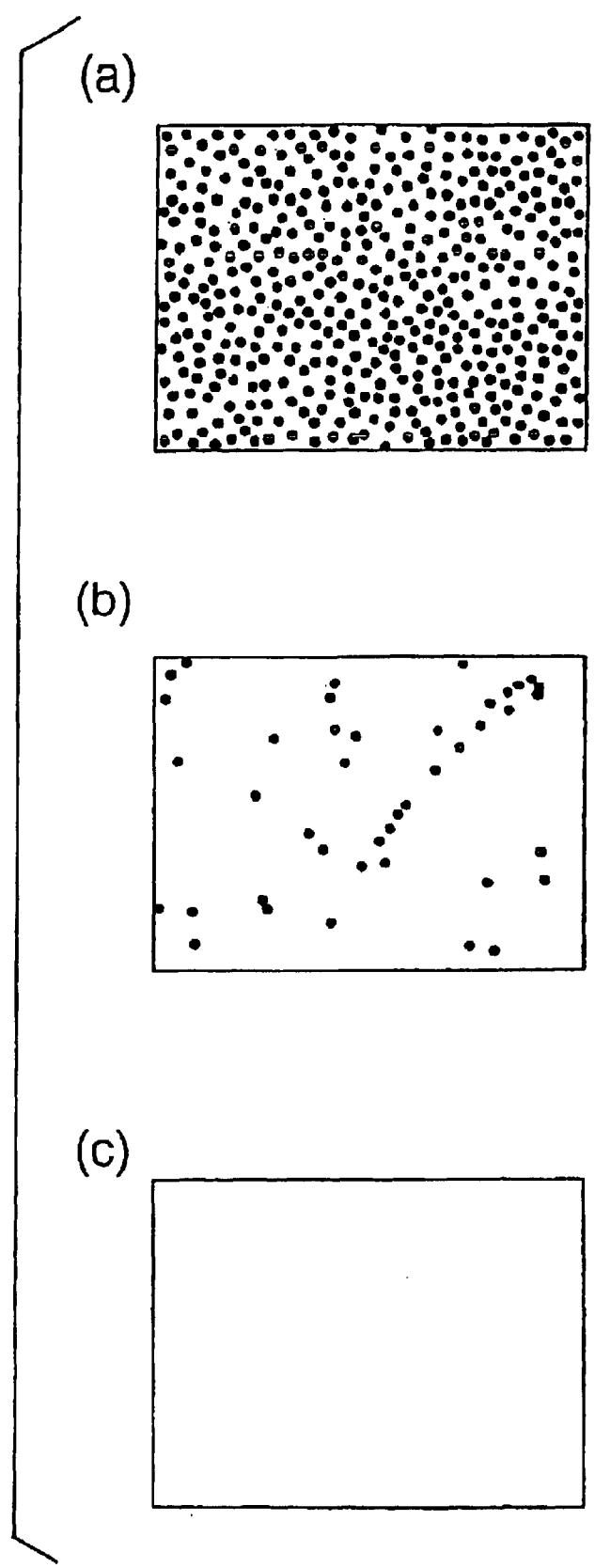
FIGS. 10(a) to 10(c) are schematic views for illustrating a method for evaluating the barrier properties against Cu.

In FIG. 8, the crystallinity of the WCN film is expressed as the half-widths for the two peaks in the X-ray diffraction due to the WCN film. The barrier properties of the WCN film are evaluated by the above-mentioned microscopic observation. The barrier properties were evaluated on a scale of three grades, ○,Δ, X. ○ represents that the barrier properties are "excellent", Δ represents that the barrier properties are "acceptable", and X represents that the barrier properties are "poor". FIGS. 10(a) to 10(c) schematically show the occurrence of pits P on the surface of Cu because of diffusion of Cu into the silicon substrate. When the pits P occurred in large amounts on the Cu surface as in FIG. 10(a), the barrier properties were evaluated as "poor" (X). When the pits P occurred in small amounts as in FIG. 10(b), the barrier properties were evaluated to be "acceptable" (Δ). When no pits P occurred as in FIG. 10(c), the barrier properties were evaluated as "excellent" (○).

As shown in FIG. 7, as the flow rate of $C_2H_4$ increased, the half-width was confirmed to increase for each of the first peak and the second peak. It is known that the narrower the half-width, the better the crystallinity. Thus, it is seen that the smaller the amount of $C_2H_4$ added, the better the crystallinity becomes.

FIG. 8 shows that when the half-width of the first peak is 3.1 or less, the barrier properties are acceptable, and particularly when it is 2.3 or less, diffusion of Cu can be prevented, and the barrier properties are excellent. It is also shown that when the half-width of the second peak is 2.5 or less, the barrier properties are acceptable, and particularly when it is 1.8 or less, diffusion of Cu can be prevented, and the barrier properties are excellent. Since the narrower the half-width, the better the crystallinity, as stated above, a WCN film with satisfactory crystallinity is found to have satisfactory barrier properties against Cu.

According to the results of analysis in FIG. 9, the horizontal axis represents the position in the depth direction of the sample, while the vertical axis represents the number of Cu ions etc. in a unit volume. From FIG. 9, it is seen that "Cu is present in the surface of the WCN film or halfway in the surface, but stops at a certain depth, and does not exist at a depth corresponding to the Si substrate." This outcome demonstrates that Cu does not diffuse into the Si substrate, and the barrier properties of the WCN film are high.

As discussed above, the crystalline WCN film has satisfactory barrier properties. The reason may be that the film is so dense because of the arrangement of crystals as to make passage of Cu difficult. Moreover, since the film is crystalline, its structural change due to a temperature rise does not occur, so that the barrier properties do not change.

In the above-described process, $C_2H_4$ is added as a film forming gas for formation of the WCN film. $C_2H_4$ is a hydrocarbon gas having a double bond. Experiments were conducted to confirm influences which the addition of such a hydrocarbon gas having a double bond or a triple bond exerts on the crystallinity and barrier properties of a WCN film. A WCN film was formed under the following process conditions by means of the ECR plasma processing apparatus shown in FIG. 5: Microwave power 2.0 kW, main electromagnetic coil current 83A, auxiliary electromagnetic coil current 0A, wafer temperature 330° C., and process pressure 2.5–2.8Pa. On this occasion, an Ar gas was used as a plasma gas, a $WF_6$ gas, an $N_2$ gas, and an $H_2$ gas were used as film forming gases other than hydrocarbon, and one of a $C_2H_4$ gas having a single bond, a $C_2H_4$ gas having a double bond, and a $C_2H_2$ gas having a triple bond was used as a hydrocarbon gas to form the WCN film. The flow rates of the introduced gases were $WF_6/N_2$/hydrocarbon gas/$H_2$/Ar=8.3/8.3/8.3/83.3/100 (unit: sccm). The so obtained WCN films were each subjected to X-ray diffraction, and their barrier properties against Cu were confirmed by the aforementioned method.

Figures 11, 12:
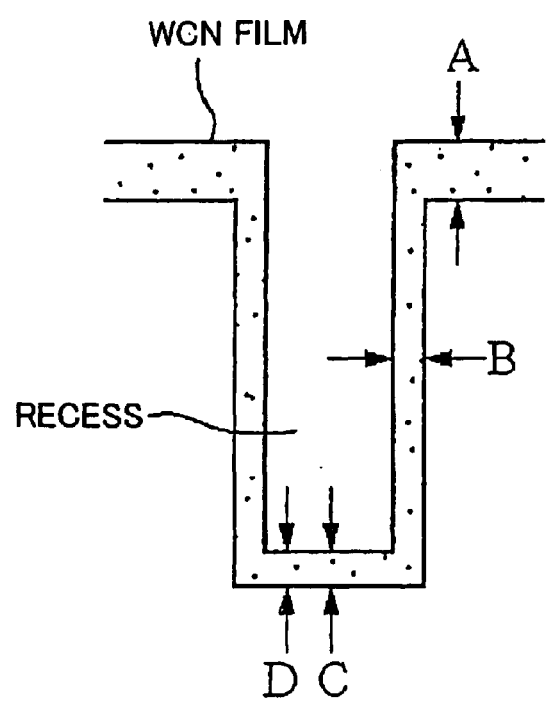
FIG. 11 is a table showing the relationship among a hydrocarbon gas, the half-width, and the barrier properties against Cu.
FIG. 12 is a sectional-view for illustrating coverage.

The results are shown in FIG. 11. The half-width was found to increase in the following order for both of the first and second peaks:

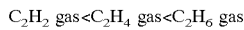

This finding shows that the use of a hydrocarbon gas having a double bond or a triple bond gives better crystallinity than the use of a hydrocarbon gas having a single bond, and this use also improves barrier properties against Cu accordingly.

An investigation of the experimental results shown in FIGS. 8 and 11 combined together shows that the barrier properties against Cu are acceptable when the half-width of the first peak is 3.2 or less, and the barrier properties are excellent particularly when the half-width is 2.3 or less; and that the barrier properties are acceptable when the half-width of the second peak is 2.6 or less, and the barrier properties are excellent particularly when the half-width is 1.8 or less.

The WCN film formed by the above-described method is satisfactory in the coverage as well as the barrier properties. The coverage herein refers to an index expressed as B/A and C/A when the film thickness at a shoulder portion of a concave is designated as A, the film thickness on the side wall of the concave is designated as B, and the film thickness at the center of the bottom wall of the concave is designated as C, as shown in FIG. 12. The greater the value of this index, the better coverage the film has.

In connection with a WN film and a WCN film hitherto considered as barrier films, experiments were conducted to compare their coverages for a concave with an aspect ratio of 5.2 (depth 2.2 μm, width 0.425 μm).

The WCN film was formed by means of the ECR plasma processing apparatus shown in FIG. 5, and the process conditions were as follows: Microwave power 2.7 kW, main electromagnetic coil current 83A, auxiliary electromagnetic coil current 0A, introduced gas flow rates $WF_6/N_2/C_2H_4/H_2$/Ar=8.3/8.3/8.3/83.3/100 (unit: sccm), wafer temperature 330° C., and process pressure 0.27 Pa. The WN film was formed with the use of the same ECR plasma processing apparatus, and the process conditions were as follows: Microwave power 2.7 kW, main electromagnetic coil current 83A, auxiliary electromagnetic coil current 0A, introduced gas flow rates $WF_6/N_2/H_2$/Ar=8.3/8.3/83.3/100 (unit: sccm), wafer temperature 330° C., and process pressure 0.27 Pa.

As a result, the film thickness of the A portion was 2,500 Angstroms for the WCN film, and 1,250 Angstroms for the WN film. The coverages at the respective sites are shown in FIG. 13. In the drawing, D denotes the film thickness at a site of the bottom wall which is near the side wall of the concave. The results show that the WCN film gives better coverage than the WN film at all sites of the concave.

The reason for the better coverage may be as follows: Reactions involving $WF_6$ and $N_2$ are considered to be

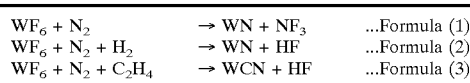

The WCN film is formed by the reaction of Formula (3), while the WN is formed by the reaction of Formula (1) and the reaction of Formula (2).

The magnitude of the thermal energy of the reaction is Formula (1)>Formula (2)>Formula (3). The reaction of Formula (3) is the lowest in thermal energy, and easily occurs as a thermal reaction. In the above-described process, the WCN film or WN film is formed by plasma CVD, but the plasma does not hit the side wall portion (B portion) of the concave, so that the side wall portion in has the film formed by a thermal reaction. For film formation in the side wall portion, therefore, the reaction of Formula (3) that is most apt to occur as a thermal reaction is advantageous. Hence, the WCN film is presumed to cause better coverage. The shoulder portion (A portion) and the bottom portion (C portion, D portion) In of the concave are bombarded with the plasma, which results in film formation. If the coverage for the side wall portion (B/A) is increased, the coverage for the bottom portion (C/A, D/A) also increases. Thus, the coverage for the side wall portion poses a problem as stated before.

As noted above, when the coverage for the side wall portion of the concave becomes satisfactory, the film thickness of the WCN film in the side wall portion increases. This obtains the effect of suppressing the lateral diffusion of the Cu wiring layer between the Cu wiring layer and the $SiO_2$ film in which the Cu wiring layer has been formed.

Furthermore, the WCN film formed by the above-described method has good adhesion to the insulator film. Experiments were conducted to compare the adhesion of a WCN film and a WN film to an $Sio_2$ film and an SiN film.

The reason why the SiO$_2$ film and the SiN film were selected as the objects for evaluation of adhesion is that only these films contact the WCN film in the semiconductor device shown in FIG. 1.

A WCN film and a WN film were formed under the same process conditions as in the coverage comparison test, and they were measured for adhesiveness by the stud pull method. The results shown in FIG. 14 were obtained, revealing that the WCN film had higher adhesion to the SiO$_2$ film and the SiN film. The reason for the satisfactory adhesion of the WCN film may be that the C of the WCN film is well bound to SiO$_2$ or the Si of the SiN film, whereby a C—Si bond is formed between the WCN film and the SiO$_2$ film or the like, and this bond suppresses peeling between both films. When the adhesion between the insulator film, such as SiO$_2$ film or SiN film, and the WCN film in contact therewith is satisfactory, the effect that film exfoliation between both films is prevented can be obtained.

Then, the following experiments were conducted to confirm the relationship between the proportions of C and N in a WCN film and the adhesion of the film: In the experiments, an Ar gas was used as a plasma gas, and a WF$_6$ gas, a C$_2$H$_4$ gas, an N$_2$ gas, and an H$_2$ gas were used as film forming gases. A WCN film was formed under the following process conditions by means of the ECR plasma processing apparatus shown in FIG. 5: Microwave power 2.7 kw, main electromagnetic coil current 83A, auxiliary electromagnetic coil current 0A, wafer temperature 330° C., and process pressure 0.27 Pa. On this occasion, the flow rate of the WF$_6$ gas was set at 8.3 sccm (constant), and the flow rate of the H$_2$ gas was set at 83.3 sccm (constant). The flow rate of the C$_2$H$_4$ gas was varied in the range of 0 sccm to 41.7 sccm, and the flow rate of the N$_2$ gas was varied in the range of 0 sccm to 16.7 sccm. As a result, WCN films of different compositions with the C/W ratio being 0 to 1.23, and the N/W ratio being 0 to 0.79 were formed. The adhesion of the WCN films, prepared under the respective conditions, to an SiO$_2$ film and an SiN film was measured by the stud pull method.

Figures 16, 17:
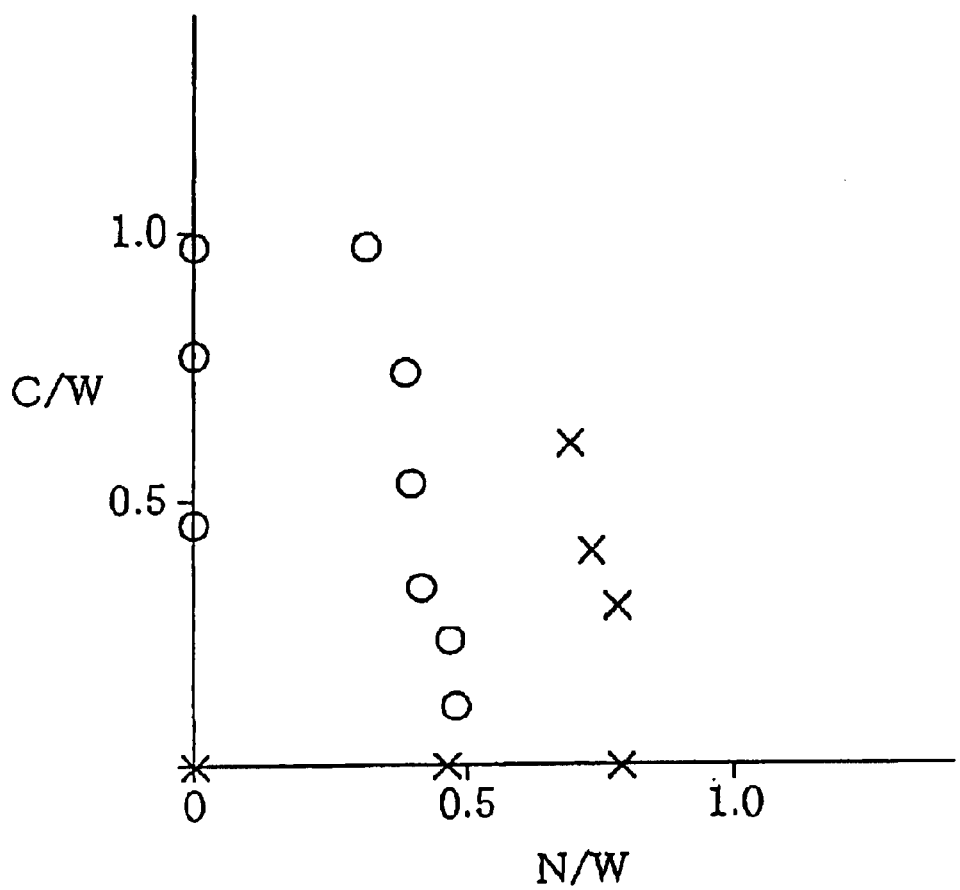
FIG. 16 is a graph for showing the relationship between the proportions of C and N in a WCN film and the adhesion of the WCN film.
FIG. 17 is a table showing the relationship between the flow rate of $CF_4$ and coverage.

The results are shown in FIGS. 15 and 16. In FIG. 16, the vertical axis represents the C/W ratio, while the horizontal axis represents the N/W ratio. (○) signifies that the adhesion to each of the SiO$_2$ film and the SiN film is 3 kpsi or more, and (X) signifies the adhesion of less than 3 kpsi.

These results show that the adhesion between the WCN film and the SiO$_2$ film and the SiN film depends on the proportions of C and N, and that to obtain adhesion to an SiO$_2$ film and an SiN film of 3 kpsi or more, it is desirable to set the C/W ratio and the N/W ratio in the ranges: 0.12<C/W<1.23 and 0<N/W<0.49.

The WCN film formed by the above-described method is lower in resistance than the WN film. Experiments for confirming this fact were conducted. A WCN film and a WN film, each 1,000 angstroms thick, were formed under the same process conditions as for the evaluation of coverage. Resistivities at 49 points in the plane of each of the WCN film and the WN film were measured. The average of the resistivity was 145 $\mu\Omega$cm for the WCN film, and 237 $\mu\Omega$cm for the WN film.

To form the WCN film of the present invention, a C—F compound gas (hereinafter referred to as "CF-based gas"), e.g. CF$_4$ gas, may be used instead of a hydrocarbon gas, as the gas containing C among the film forming gases. In this case, coverage can be increased further.

Experiments were performed to compare film coverage of a concave with an aspect ratio of 5.2 when a WCN film was formed using a hydrocarbon gas and when a WCN film was formed using a CF-based gas.

To form a WCN film with the use of a CF-based gas, the ECR plasma processing apparatus shown in FIG. 5 was used, and the following process conditions were employed: Microwave power 2.7 kW, main electromagnetic coil current 83A, auxiliary electromagnetic coil current 0A, introduced gas flow rates WF$_6$/N$_2$/CF$_4$/H$_2$/Ar=8.3/8.3/0–16.7/83.3/100 (unit: sccm), wafer temperature 330° C., and process pressure 2.5–2.7 Pa. On this occasion, the flow rate of the CF$_4$ gas was varied in the range of 0 sccm to 16.7 sccm. The process conditions when the hydrocarbon gas was used were the same as in the previously mentioned coverage evaluation test.

The results are shown in FIG. 17. The results demonstrate that the formation of the WCN film using the CF-based gas improved coverage at all sites of the concave. The reason may be that CF$_4$ causes a WCN formation reaction in a vapor phase less frequently, and a surface reaction more frequently, than C$_2$H$_4$.

The WCN film formed under the foregoing process conditions with the use of the CF-based gas was subjected to X-ray diffraction. The aforementioned first and second peaks were confirmed to exist. This finding made sure that a crystalline WCN film could be formed even using a CF-based gas. The WCN film was also evaluated for the barrier properties against Cu, and adhesion to an SiO$_2$ film and an SiN film. The WCN film was found to have the same barrier properties and adhesion as when a hydrocarbon gas was used.

According to the present invention, moreover, the barrier film may be formed from a WC film. The WC film refers to a film containing w and C, and its film composition is expressed as WC$_x$. This composition can be set in a predetermined range by changing the flow rate ratio of the film forming gases to be described later on.

The WC film is formed by converting film forming gases into a plasma, for example, with the use of an Ar gas as a plasma gas, and gases containing W and C, such as a WF$_6$ gas, a C$_2$H$_4$ gas, and an H$_2$ gas as the film forming gases, for example, in the ECR plasma processing apparatus shown in FIG. 5. Concretely, the WC film can be formed under the following process conditions: Microwave power 2.7 kw, main electromagnetic coil current 83A, auxiliary electromagnetic coil current 0A, introduced gas flow rates WF$_6$/C$_2$H$_4$/H$_2$/Ar=8.3/8.3/50/100 (unit: sccm), wafer temperature 330° C., and process pressure 0.27 Pa.

Figure 18:
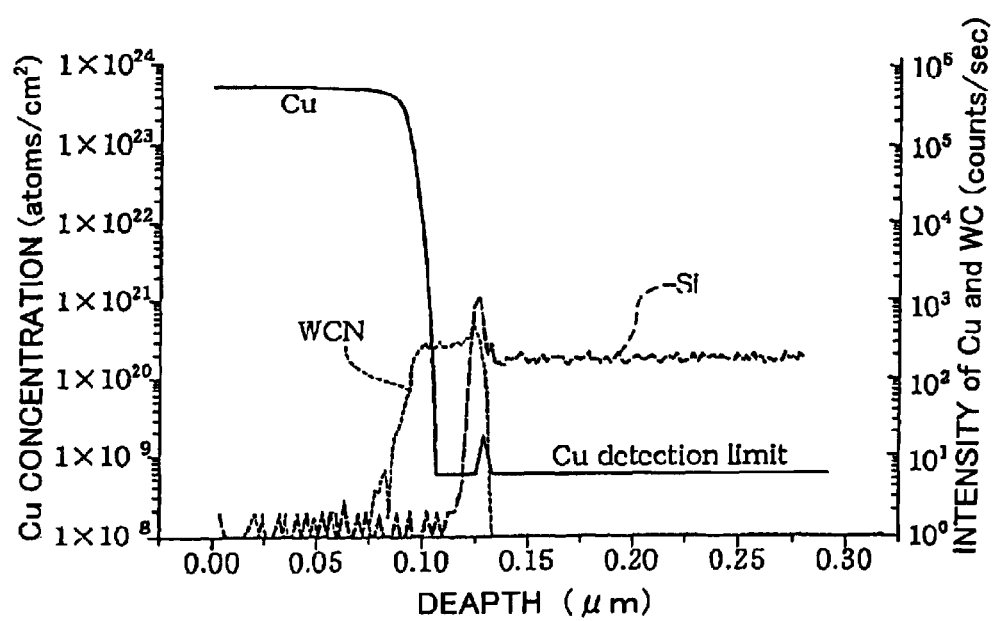
FIG. 18 is a graph showing the results of SIMS analysis of the semiconductor device.

The WC film was formed under the above process conditions. To confirm the barrier properties of the WC film against Cu, SIMS analysis was made. As a result, Cu was found not to diffuse into an Si substrate, as shown in FIG. 18. Thus, a WC film is understood to have high barrier properties similarly to a WCN film.

The WC film formed under the above-mentioned process conditions was measured for adhesion to an SiO$_2$ film and an SiN film by the stud pull method. The adhesion was 5.8 kpsi for the SiO$_2$ film, and 6.2 kpsi for the SiN film, showing the WC film to have higher adhesion to these films than does a WCN film. Film coverage by the WC film was evaluated, showing that the WC film gives better coverage than a WN film.

In the semiconductor device according to the present invention, an SiOF film or a CF film may be used as the interlayer insulator film, besides an SiO$_2$film. The CF film has drawn attention as a film with low specific inductive capacity, but involves the problem of low adhesion. Thus, the adhesion between the CF film and a WCN film was evaluated in the following manner: A CF film 7,000 angstroms thick was formed on the surface of an SiN film, and a WCN film 1,000 angstroms thick was formed on the surface of the CF film to prepare a sample. A tape was stuck to the surface of the WCN film, and whether peeling would occur between the CF film and the WCN film when the tape was removed was observed visually. For comparison, the same evaluation was made using a sample having a WN film formed instead of the WCN film.

No peeling was observed between the CF film and the WCN film, while peeling was noted between the CF film and the WN film, showing the WCN film to be higher in adhesion to the CF film than the WN film. The process conditions for the WCN film and the WN film were the same as in the aforementioned evaluation of coverage. The same evaluation was performed for a WCN film and a WC film which were formed using a CF-based gas. No peeling was observed between each of these films and a CF film.

As described above, adhesion between a WCN film and a CF film is satisfactory. Likewise, satisfactory adhesion is obtained when a WCN film or WC film with a thickness of several tens of Angstroms is formed on the surface of an interlayer insulator film such as a CF film, and a WN film is formed on this surface.

According to the present invention, moreover, $WCl_6$ gas, $(C_5H_5)_2WH_2$ gas, $[(CH_3)_2N]_6W_2$ gas, $W[N(CH_3)_2]_6$ gas, $W[N(C_2H_5)_2]_6$ gas, and $(C_3H_7C_5H_5)_2WH_2$ gas can be used, in addition to $WF_6$ gas, as the gas containing W among film forming gases for a WCN film. As the hydrocarbon gas, $CH_4$ gas, $C_6H_6$ gas, and $(C_6H_5)CH_3$ gas can be used in addition to $C_2H_4$ gas, $C_2H_2$ gas, and $C_2H_6$ gas. As the gas containing N and H, $NH_3$ gas can be used. As the CF-based gas, $C_2F_6$ gas, $C_4F_8$ gas, $C_5F_8$ gas, $C_6F_6$ gas, $C_6F_{10}$ gas, and $C_6F_5CF_3$ (perfluorotoluene) gas can be used in addition to $CF_4$ gas. Further, a CHF-based gas, such as $C_2H_2F_4$ gas, $CHF_3$ gas, $C_2H_2F_2$ gas, $C_6H_4(CF_3)_2$ (1,4-bistrifluoromethylbenzene) gas, may be used.

According to the film forming process of the present invention, film forming gases containing W, C, N and H may be used at an initial stage of film formation to form a film, and then film forming gases containing W, N and H may be used to form a film. In this case, a WCN film is formed on the surface of an insulator film, and a WN film is formed on the upper surface of the WCN film. Since the WCN film is formed on the surface of the insulator film, coverage and adhesion to the insulator film are satisfactory, and the barrier properties against Cu are also satisfactory.

According to the present invention, moreover, the WCN film is formed by use of ECR as a plasma generative energy. However, for example, an apparatus that generates plasma by a method called ICP ("inductive couple plasma"), in which an electric field and a magnetic field are imparted to a process gas from a coil wound round a dome-shaped vessel, may be used. Also, an apparatus that generates a plasma by a method called a "helicon wave plasma", in which the interaction between a helicon wave of, for example, 13.56 MHz and a magnetic field applied by a magnetic coil, may be used. Furthermore, an apparatus that generates a plasma by a method called a "magnetron plasma", in which a magnetic field is applied so as to be almost parallel to two parallel cathodes, may be used.

Figure 19:
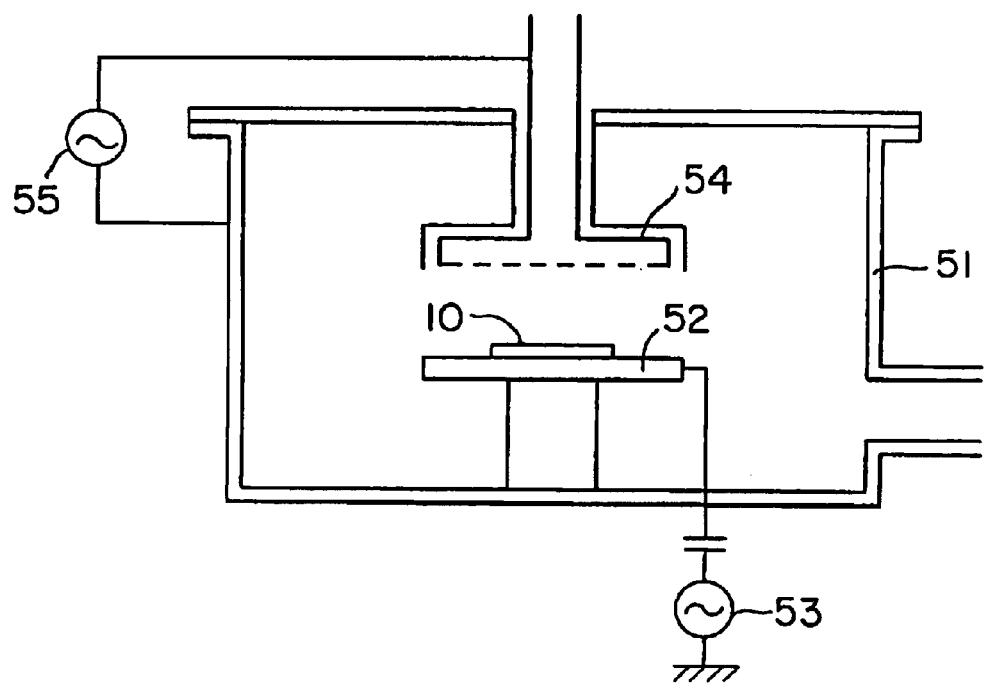
FIG. 19 is a view schematically showing the constitution of a parallel plate type plasma processing apparatus for a WCN film-forming process.

Furthermore, an apparatus device called a "parallel plates type" that generates a plasma by a method, in which a high frequency power is applied between opposed electrodes, may be used. A test was conducted to form a WCN film by use of a parallel plates type plasma processing apparatus as shown in FIG. 19. The parallel plate type plasma processing apparatus used will be explained briefly. A table 52 having a heater, an electrostatic chuck, and a lower electrode (not shown) is provided in a lower portion within a vacuum vessel 51 of the plasma processing apparatus of parallel plates type. The lower electrode of the table 52 is supplied with an RF power by a lower RF power source 53. A shower head 54 having an upper electrode (not shown) to be supplied with an RF power by an upper RF power source 55 is provided in an upper portion of the vacuum vessel 51. The interior of the vacuum vessel 51 can be reduced in pressure by a vacuum pump (not shown). Various gases can be introduced into the vacuum vessel 51 from a gas supply source (not shown) via the shower head 54.

The process conditions for formation of the WCN film were as follows: An RF power of 1.5 kw given at 60 MHz to the upper electrode (no RF power given to the lower electrode), introduced gas flow rates $WF_6/N_2/C_2H_4/H_2/Ar=$ 8.3/8.3/4.2/83.3/100 (unit: sccm), wafer temperature 360° C., and process pressure 0.7 Pa. As a result, it was confirmed that a WCN film having characteristics comparable to those obtained with the use of an ECR plasma processing apparatus was obtained.

Finally, a test was conducted to investigate the effects of the process temperature (wafer temperature) and process pressure on the crystallinity of a WCN film. The results are described here. A WCN film was formed using the ECR plasma processing apparatus shown in FIG. 5. Of the process conditions, the wafer temperature was varied in the range of 209 to 476° C., the process pressure was varied in the range of 0.33 to 20 Pa, and the microwave power was varied in the range of 1 to 4 kW. The other process conditions were the main electromagnetic coil current 79A, auxiliary electromagnetic coil current 0A, and constant introduced gas flow rates $WF_6/N_2/C_2H_4/H_2/Ar=4.7/2.3/4.7/$ 93/100 (unit: sccm). Data obtained are shown in FIG. 20 as the relationship between the process pressure/process temperature and the resistivity.

Further, a WCN film was formed using the ECR plasma processing apparatus shown in FIG. 5. Of the process conditions, the wafer temperature was varied in the range of 209 to 476° C., and the process pressure was varied in the range of 0.33 to 20 Pa. The other process conditions were the microwave power 2.7 kW, main electromagnetic coil current 79A, auxiliary electromagnetic coil current 0A, and constant introduced gas flow rates $WF_6/N_2/C_2H_4/H_2/Ar=4.7/2.3/4.7/$ 93/100 (unit: sccm). Data obtained are shown in FIG. 21 as the relationship between the resistivity and the first peak/second peak.

FIG. 21 shows that the lower the resistivity, the smaller the half-widths of the first and the second peak, namely, the higher the crystallinity of the film. A comparison is made between FIGS. 21 and 8. FIG. 8 shows that when the half-widths of the first and second peaks are 3.10 and 2.50, respectively, the barrier properties are acceptable. FIG. 21, on the other hand, shows that when the half-widths of the first and second peaks are 3.05 and 2.39, respectively, the resistivity is 347 $\mu\Omega$cm. These findings show that when the resistivity is at least 347 $\mu\Omega$cm or less, the barrier properties are acceptable. In consideration of the difference between the value 3.10 and the value 3.05, and the difference between the value 2.50 and the value 2.39, it is concluded that when the resistivity is at least 350 $\mu\Omega$cm or less, a WCN film having acceptable barrier properties can be obtained. FIG. 8 also shows that when the half-widths of the first and second peaks are 2.30 and 1.80, respectively, the barrier properties are excellent. FIG. 21, on the other hand, shows that when the half-widths of the first and second peaks are 2.31 and 1.65, respectively, the resistivity is 275 μΩcm. These findings show that when the resistivity is at least 275 μΩcm or less, the barrier properties are excellent.

The graph of FIG. 20 will be discussed on the above premise. In the graph of FIG. 20, the vertical axis represents the resistivity, and the horizontal-axis represents the process pressure and the process temperature. FIG. 20 shows that to make the resistivity 350 μΩcm or less, namely, to obtain a WCN film having acceptable barrier properties, the process pressure should be 10 Pa or less. When the process pressure is 5.8 Pa, the resistivity is 274.7 μΩcm. Thus, it is found that the process pressure should be 5 Pa or less in order to obtain a WCN film having excellent barrier properties. Looking only at the graph of FIG. 20, it appears that a lower process pressure is necessary to make the crystallinity of a WCN film higher. In fact, if the process pressure is too low, the formation of a plasma will be problematical. Thus, the process pressure should preferably be 0.05 Pa or higher.

Similarly, FIG. 20 shows that to make the resistivity 350 μΩcm or less, namely, to obtain a WCN film having acceptable barrier properties, the process temperature should be 250° C. or higher. To obtain a WCN film having excellent barrier properties, the process temperature should preferably be 300° C. or higher. From FIG. 20, it is seen that the higher the process temperature, the better barrier properties the resulting WCN film has. However, the upper limit of the process temperature should preferably be 500° C. or lower. This is because changes will occur in the characteristics of other layers formed before formation of the WCN film, e.g., the Cu wiring layer below the WCN film, or the lowermost P-doped diffusion layer of the transistor.

What is claimed is:

1. A semiconductor device comprising:
   an insulator film formed on a substrate;
   a wiring layer of copper formed proximate the insulator film; and
   a crystalline film containing tungsten, carbon, and nitrogen for preventing copper diffusion from the wiring layer to the insulator film, the crystalline film arranged between the insulator film and the wiring layer,
   wherein the crystalline film, when subjected to X-ray diffraction, has a spectrum having a first peak between 36 degrees and 38 degrees and a second peak between 42 degrees and 44 degrees.

2. The semiconductor device of claim 1, wherein a half-width of the first peak is 3.2 degrees or less.

3. The semiconductor device of claim 1, wherein a half-width of the second peak is 2.6 degrees or less.

4. A semiconductor device comprising:
   an insulator film formed on a substrate;
   a $WC_xN_y$ crystalline film formed on the insulator film; and
   a wiring layer of copper formed on the crystalline film,
   wherein the crystalline film prevents copper diffusion from the wiring layer to the insulator film, and
   wherein the crystalline film, when subjected to X-ray diffraction, has a spectrum having a first peak between 36 degrees and 38 degrees and a second peak between 42 degrees and 44 degrees.

5. The semiconductor device according to claim 4, wherein a half-width of the first peak is 3.2 degrees or less.

6. The semiconductor device according to claim 4, wherein a half-width of the second peak is 2.6 degrees or less.

* * * * *